(12) United States Patent
Ma (10) Patent No.: US 9,859,445 B2
(45) Date of Patent: Jan. 2, 2018

(54) ARRAY SUBSTRATE, DISPLAY PANEL AND DISPLAY DEVICE

(71) Applicants: BOE Technology Group Co., Ltd., Beijing (CN); Hefei BOE Optoelectronics Technology Co., Ltd., Anhui (CN)

(72) Inventor: Juncai Ma, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/231,845

(22) Filed: Aug. 9, 2016

(65) Prior Publication Data

US 2017/0104105 A1    Apr. 13, 2017

(30) Foreign Application Priority Data

Oct. 13, 2015  (CN) .......................... 2015 1 0671731

(51) Int. Cl.
*H01L 29/78* (2006.01)
*H01L 29/786* (2006.01)
(Continued)

(52) U.S. Cl.
CPC ...... *H01L 29/78696* (2013.01); *H01L 27/124* (2013.01); *H01L 29/41733* (2013.01)

(58) Field of Classification Search
CPC ............. H01L 29/78696; H01L 27/124; H01L 29/41733
See application file for complete search history.

(56) References Cited

U.S. PATENT DOCUMENTS 7,910,926 B2 *  3/2011  Ishii ...................... G02F 1/1368
                                                            257/217
2006/0102897 A1   5/2006  Suh et al.

FOREIGN PATENT DOCUMENTS

CN    102566178 A    7/2012
CN    104269410 A    1/2015

OTHER PUBLICATIONS

Copy of first Office Action, including Search Report, for Chinese Patent Application No. 201510671731.3, dated Aug. 31, 2017, 8 pp.

* cited by examiner

*Primary Examiner* — Roy Potter
*Assistant Examiner* — Paul Patton
(74) *Attorney, Agent, or Firm* — Westman, Champlin & Koehler, P.A.

(57) ABSTRACT

The present invention discloses an array substrate, a display panel and a display device. The array substrate includes a substrate, a gate line and a data line arranged on the substrate, and a thin film transistor arranged in an overlapping region where the gate line and the data line are overlapped; wherein an orthogonal projection of the thin film transistor on the substrate covers an orthogonal projection of the overlapping region of the gate line and the data line on the substrate. Because of design of a location of the thin film transistor according to the present invention, the opening ratio can be increased, the slightly rubbing region adjacent to the thin film transistor can be reduced; and, because of the closed channel region, levels at various positions of the thin film transistor can be uniform, and a bigger contact area provided for the supporting post, thereby increasing supporting ability of the supporting post and compressive property of the panel.

15 Claims, 6 Drawing Sheets

(51) Int. Cl.
*H01L 29/417* (2006.01)
*H01L 27/12* (2006.01)

Fig. 8

ARRAY SUBSTRATE, DISPLAY PANEL AND DISPLAY DEVICE

CROSS-REFERENCE TO RELATED APPLICATION

This application claims the benefit of Chinese Patent Application No. 201510671731.3 filed on Oct. 13, 2015 in the State Intellectual Property Office of China, the whole disclosure of which is incorporated herein by reference.

BACKGROUND

1. Field of the Invention

Embodiments of the present invention relate to display field, and particularly to an array substrate, a display panel and a display device.

2. Description of the Related Art

Currently, as for production of a display device, a thin film transistor plays an important role on an array substrate. A structure of a common thin film transistor includes a substrate, a gate electrode arranged on the substrate, an active layer arranged on the gate electrode and insulated from the gate electrode, and a source and drain electrode arranged to be opposite to each other and electrically connected to the active layer. When an electrical current is applied to the gate electrode by a circuit mounted to the substrate, the electrical current loaded to the source electrode is transmitted to the drain electrode through the active layer, thereby driving a pixel unit of the display device to display an image.

However, there are problems to be solved in prior art, i.e., how to reduce a slightly rubbing region adjacent to the thin film transistor that possesses a rather great area and how to prevent a supporting post from sliding in a lateral direction, with an opening ratio being ensured.

SUMMARY

Embodiments of the present invention provide an array substrate, which includes a substrate, a gate line and a data line arranged on the substrate, and a thin film transistor arranged in an overlapping region where the gate line and the data line are overlapped; wherein an orthogonal projection of the thin film transistor on the substrate covers an orthogonal projection of the overlapping region of the gate line and the data line on the substrate.

In an embodiment, a source electrode of the thin film transistor has a hollow region; and a drain electrode of the thin film transistor is arranged in the hollow region of the source electrode and a closed channel region is formed between the source electrode and the drain electrode.

In an embodiment, a pattern of the closed channel region is a closed ring-shaped pattern.

In an embodiment, a center of the overlapping region of the gate line and the data line coincides with a center of the channel region.

In an embodiment, the source electrode of the thin film transistor has first patterns located on both sides of the data line and protruded from the data line;

the gate electrode of the thin film transistor has second patterns located on both sides of the gate line and protruded from the gate line; and an orthogonal projection of the first pattern protruded from the data line on the substrate at least partially overlaps with an orthogonal projection of the second pattern protruded from the gate line on the substrate.

In an embodiment, the first pattern protruded from the data line and the second pattern protruded from the gate line are each a triangle pattern.

In an embodiment, an orthogonal projection of the source electrode on the substrate fully coincides with an orthogonal projection of the gate electrode on the substrate.

In an embodiment, a rubbing direction of an orientation film on the substrate is consistent with an extending direction of the data line and the rubbing direction is a direction from a first side of the first pattern protruded from the data line towards a second side thereof; and a length of the first side is smaller than a length of the second side and the first side is located upstream of the second side in the rubbing direction.

Embodiments of the present invention further provide a display panel comprising the array substrate as mentioned above and an opposite substrate, which are arranged to be opposite to each other.

In an embodiment, a black matrix is provided on the array substrate or the opposite substrate and an orthogonal projection of the black matrix on the substrate covers an orthogonal projection of the thin film transistor on the substrate.

Embodiments of the present invention further provide a display device comprising the display panel as mentioned above.

BRIEF DESCRIPTION OF THE DRAWINGS

FIG. b is a schematic view of a rubbing region and supporting post sitting region in the array substrate as shown in FIG. 1a;

FIG. 2b is a schematic view of the rubbing region and the supporting post sitting region in the array substrate as shown in FIG. 2a;

FIG. 3 is a schematic view of a data line in the array substrate according to the embodiment of the present invention as shown in FIG. 2a;

FIG. 4 is a schematic view of a gate line in the array substrate according to the embodiment of the present invention as shown in FIG. 2a;

FIG. 6b is a schematic view of a rubbing region and supporting post sitting region in the array substrate as shown in FIG. 6a;

DETAILED DESCRIPTION OF THE EMBODIMENTS

An array substrate, a display panel and a display device provided according to embodiments of the present invention will be described in detailed in conjunction with the drawings.

In the drawings, a thickness and shape of each of the layers do not reflect a real scale of the array substrate, but are intended to schematically illustrate the content of the present invention.

Figure 1A:
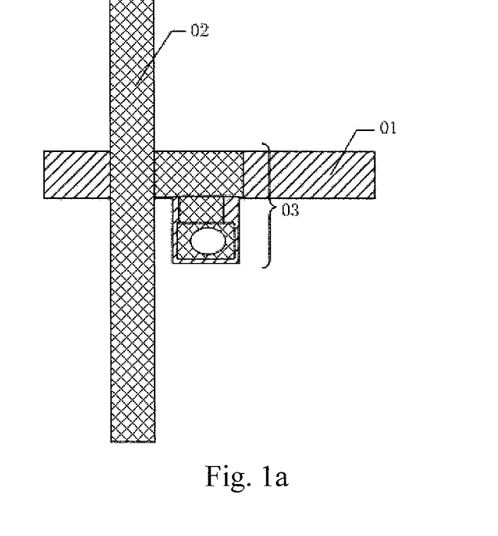
FIG. 1a is a structural schematic view of an array substrate in related art.
Figure 1B:
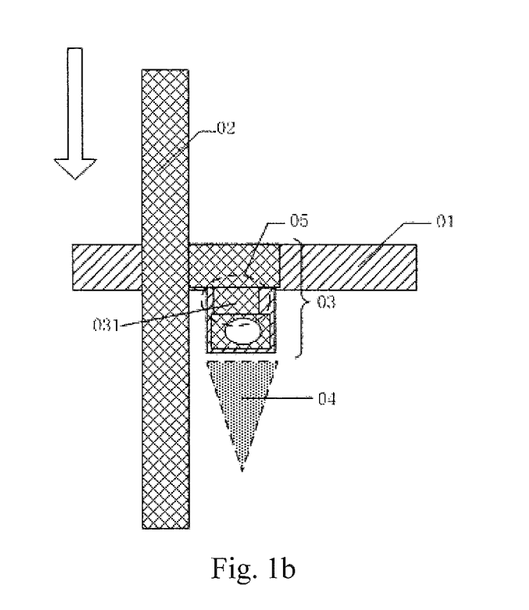

FIG. 1a illustrates a related array substrate, which includes a gate line 01 and a data line 02 which are arranged on a substrate. A thin film transistor 03 is formed at a region adjacent to a position where the gate line 01 and the data line 02 are overlapped. As shown in FIG. 1b, the thin film transistor 03 is arranged within a pixel region of the array substrate, which, on one hand, adversely affects an opening ratio of a display panel, and on the other hand, renders a rather large slightly rubbing region 04 (an arrow direction in FIG. 1b indicates a rubbing direction of an orientation film) adjacent to the thin film transistor. In addition, as a supporting post sitting region 05 is provided at either side of the channel region 031 in the thin film transistor and is in contact with a supporting post, a contacting area with the supporting post is small and a supporting force by the supporting post is decreased, rendering sliding in a lateral direction, non-uniform display and a pressing-induced water-ripple phenomenon.

Figure 2A:
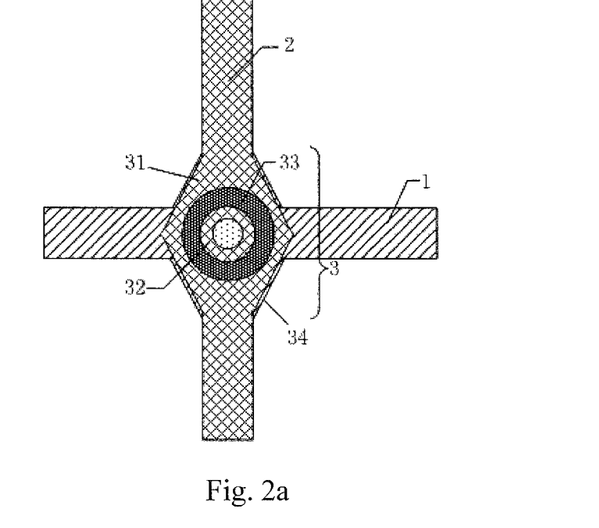
FIG. 2a is a first structural schematic view of an array substrate according to an embodiment of the present invention.

Embodiments of the present invention provide an array substrate, as shown in FIG. 2a, which includes a substrate, a gate line 1 and a data line 2 that are arranged on the substrate and a thin film transistor 3 arranged within an overlapping region where the gate line 1 and the data line 2 are overlapped.

An orthogonal projection of the thin film transistor 3 on the substrate covers an orthogonal projection of the overlapping region of the gate line 1 and the data line 2 on the substrate.

In the embodiment of the present invention, a source electrode 31 of the thin film transistor 3 may be provided with a hollow region; a drain electrode 32 of the thin film transistor 3 is disposed in the hollow region of the source electrode 31; and a closed channel region 33 is formed between the source electrode 31 and the drain electrode 32.

Figure 2B:
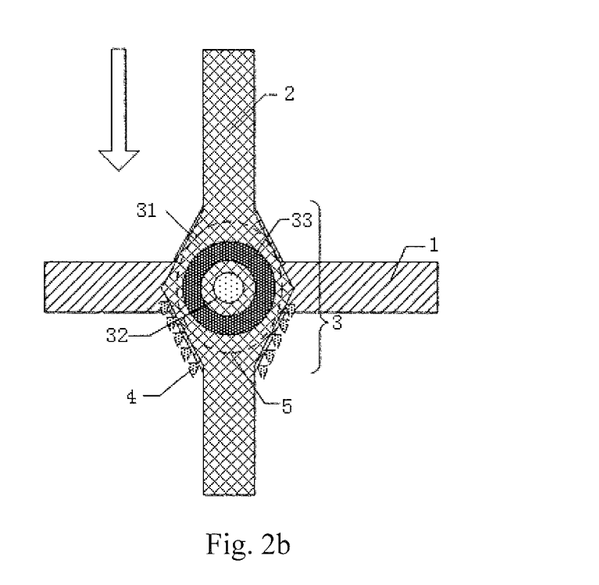

In the array substrate provided according to the embodiment, as shown in FIG. 2b, opening ratio can be increased and slightly rubbing region 4 adjacent to the thin film transistor can be reduced as the orthogonal projection of the thin film transistor 3 on the substrate covers an orthogonal projection of the overlapping region of the gate line 1 and the data line 2 on the substrate, i.e., the thin film transistor 3 is not located in a pixel region of the array substrate. In addition, because of the closed structure of the channel region 33 of the thin film transistor, levels of the thin film transistor 3 at different locations may be uniform and the sitting region 5 of the support post may be increased. In this instance, the support post may be provided with an increased contacting area, supporting ability of the support post may be increased and compressive property of the panel may be improved.

In a specific implementation, in the array substrate according to the embodiment of the present invention, as shown in FIG. 2a, the channel region 33 may be configured in a closed ring-shaped pattern. In this way, in a situation where a ratio of width to length (W/L) of the channel region is constant, the channel region of the closed ring-shaped structure occupies minimum area and thus product cost can be reduced. Further, the closed ring-shaped channel region can achieve a great ratio of width to length (W/L) and thus an increased charging efficiency and an improved response time of the panel. It is noted that the channel region in embodiments of the present invention may have any suitable shape, such as a frame shape, i.e., a square-frame shape, a rectangle-frame shape, an elliptical-frame shape, a polygonal-frame shape, an irregular-frame shape and the like, and the closed ring-shaped pattern is not limited to the mentioned closed ring-shaped pattern. A pattern of the closed channel region may be set as required and is not limited herein.

In a specific implementation, in order to further increase the opening ration and reduce the slightly rubbing region adjacent to the thin film transistor, the array substrate according to the embodiment may be configured such that a center of the overlapping region of the gate line and the data line coincides with a center of the channel region.

Figure 3:
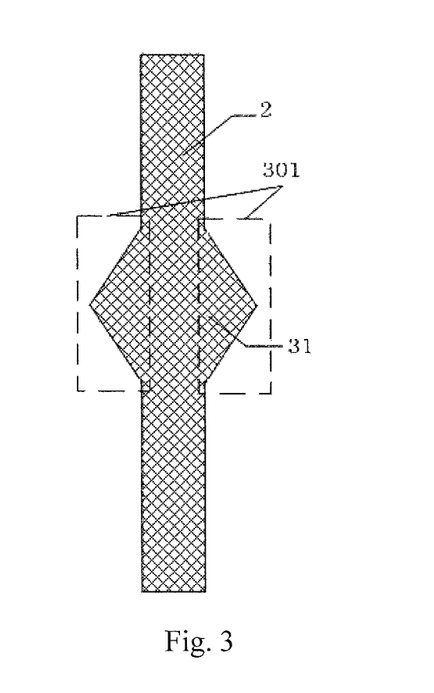
Figure 4:
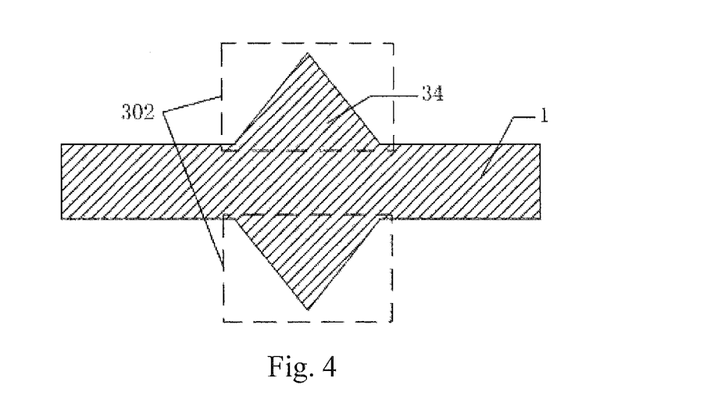

In a specific implementation, in order to obtain a desired ratio of width to length of the channel region and further reduce the slightly rubbing region adjacent to the thin film transistor, the array substrate according to the embodiment may be configured such that, as shown in FIG. 3, the source electrode 31 has first patterns 301 located at both sides of the data line 2 and protruded from the data line 2. As shown in FIG. 4, the gate electrode 34 of the thin film transistor 3 has second patterns 302 located at both sides of the gate line 1 and protruded from the gate line 1. An orthogonal projection of the first pattern 301 protruded from the data line 3 on the substrate at least partially overlaps with that of the second pattern 302 protruded from the gate line 1 on the substrate, which ensures normal operation of the thin film transistor to be not affected.

In a specific implementation, in the array substrate according to the embodiments of the present invention, as shown in FIGS. 3 and 4, the first pattern 301 protruded from the data line 3 and the second pattern 302 protruded from the gate line 1 may both be configured to be a triangle pattern. In this instance, the pattern of the gate electrode may be considered as a rhombus-like pattern and the pattern of the source electrode may be considered as a rhombus-like pattern too. It is to be noted that the first pattern protruded from the data line and the second pattern protruded from the gate line are not limited to the triangular patterns mentioned herein and may be set as required and are not limited here.

Figure 5:
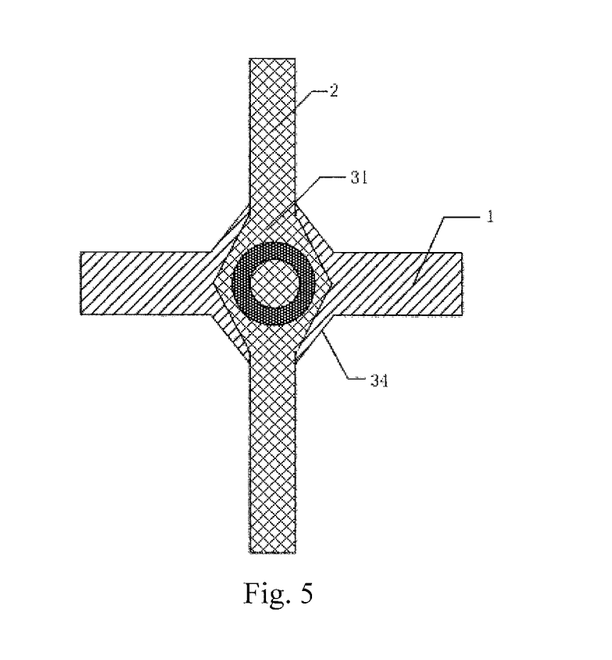
FIG. 5 is a second structural schematic view of an array substrate according to an embodiment of the present invention.

In a specific implementation, in the array substrate according to the embodiments of the present invention, as shown in FIG. 5, the orthogonal projection of the source electrode 31 on the substrate at least partially overlaps with that of the gate electrode 34 on the substrate; or, in order to reduce consumption of metal material and reduce product cost, as shown in FIG. 2, the orthogonal projection of the source electrode 31 on the substrate may fully coincides with the orthogonal projection of the gate electrode 34 on the substrate, in the situation where the first pattern 301 protruded from the data line 3 and the second pattern 302 protruded from the gate line 1 are each configured to be a triangle pattern. The positional relationship between the source electrode and the gate electrode may be set as required and is not limited herein.

Figure 6A:
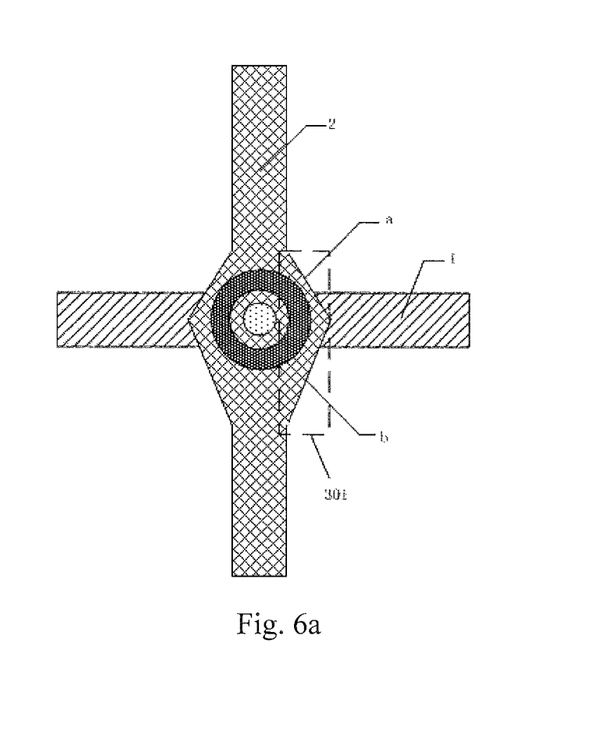
FIG. 6a is a third structural schematic view of an array substrate according to an embodiment of the present invention.
Figure 6B:
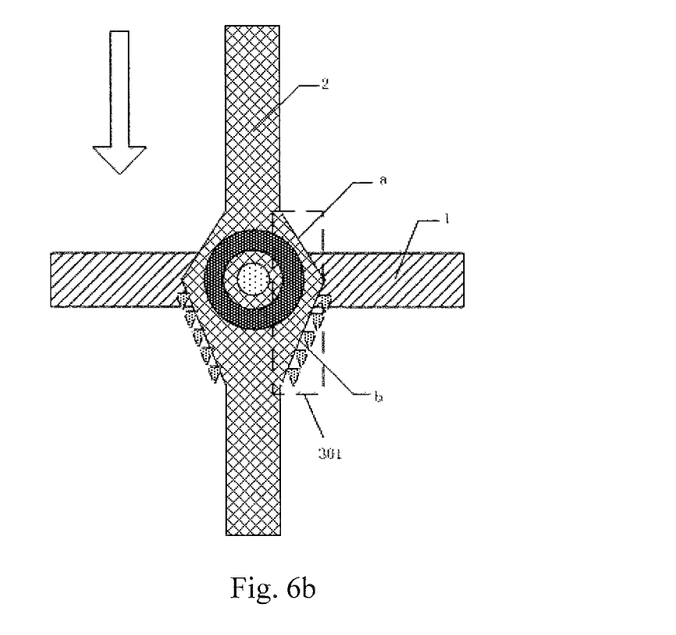

In a specific implementation, in the array substrate according to the embodiments of the present invention, as shown in FIGS. 6a and 6b, in order to further reduce influence of the slightly rubbing region on the display region, when a rubbing direction of an orientation film on the array substrate is consistent with an extending direction of the data line, the rubbing direction (as indicated by the arrow in FIG. 6b) may be configured to be a direction from a first side a of the first pattern 301 (for example, a triangle pattern) protruded from the data line 3 towards a second side b of the first pattern 301; in this instance, a length of the first side a is smaller than a length of the second side b. If the length of the first side is greater than the length of the second side, the rubbing direction shall be in opposition to the direction indicated by the arrow in FIG. 6b. That is, the first side is located upstream of the second side in the rubbing direction. If the length of the first side is equal to the length of the second side, the rubbing direction is consistent with the extending direction of the data line and will not be limited herein.

Figure 7:
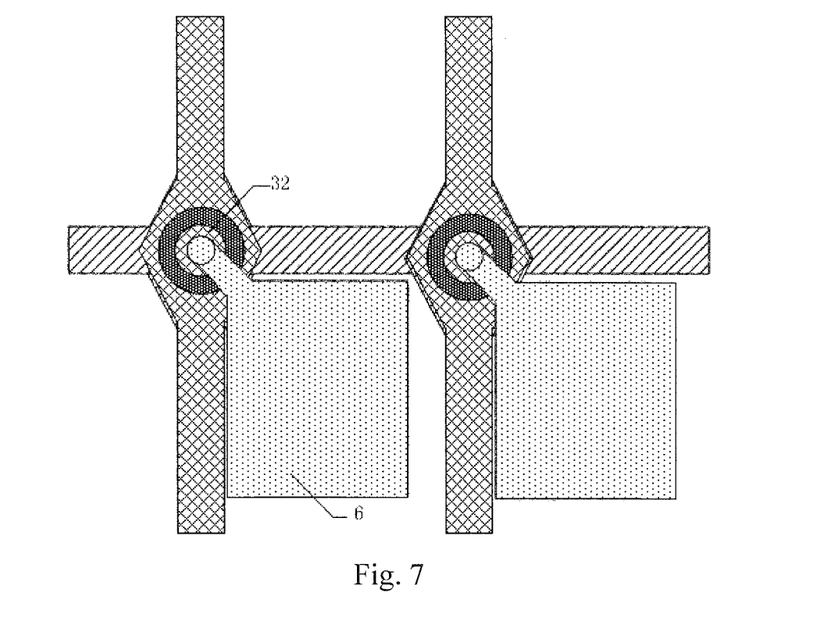
FIG. 7 is a structural schematic view of an array substrate having a pixel electrode according to an embodiment of the present invention.

In a specific implementation, as shown in FIG. 7, the array substrate according to the embodiments of the present invention further comprises a drain electrode 32 and a pixel electrode 6 electrically connected to the drain electrode 32 through a through hole in a passivation layer. The array substrate according to the embodiments of the present invention generally further includes other film structures such as an active layer, an insulating layer, an orientation layer and the like, and is generally provided with structures such as a common electrode line on the substrate The specific structures may be implemented in various manners and will not be limited here.

Based on the same inventive conception, embodiments of the present invention further provide a display panel, which includes the array substrate as mentioned above and an opposite substrate that is arranged to be opposite to the array substrate. The above embodiments of the array substrate may be referred to for the embodiments of the display panel and the embodiments of the display panel are not repeatedly described here.

Figure 8:
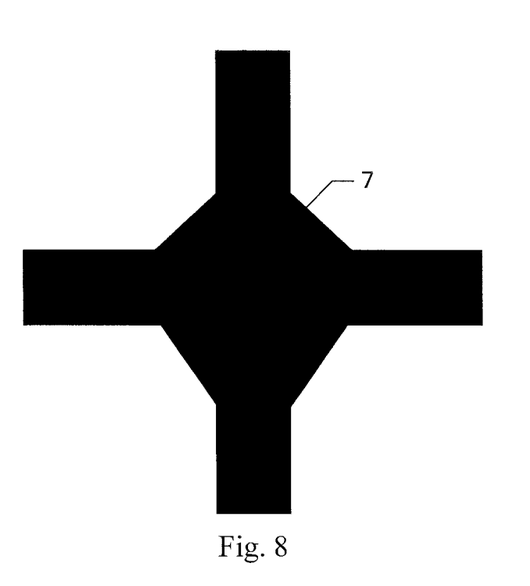
FIG. 8 is a structural schematic view of a black matrix according to an embodiment of the present invention.

In a specific implementation, in order to shield light, the above display panel according to the embodiment of the present invention is configured such that a black matrix 7 is provided on the array substrate or the opposite substrate and an orthogonal projection of the black matrix 7 on the substrate may at least cover an orthogonal projection of the thin film transistor on the substrate. The embodiment of the display panel as shown in FIG. 8 may be obtained by adding the black matrix 7 to the embodiment as shown in FIG. 2. Components such as the gate line and the data line, etc. are shielded by the black matrix and thus cannot be seen.

Based on the same inventive conception, embodiments of the present invention further provide a display device, which includes the display panel according to the above embodiments of the present invention. The display device may be a mobile phone, a tablet computer, a television, a display, a notebook computer, a digital photo frame, a navigator, or other products or components having display function. Other parts of the display device that are indispensable are known to those skilled in the art and are not repeatedly described herein and should not be considered as limitation of the present invention. Embodiments of the display device may be known by referring the embodiments of the array substrate and the display panel and are not repeatedly described herein.

Embodiments of the present invention provide an array substrate, a display panel and a display device, which include a substrate, a gate line and a data line arranged on the substrate, and a thin film transistor arranged in an overlapping region of the gate line and the data line; an orthogonal projection of the thin film transistor on the substrate covers an orthogonal projection, on the substrate, of the overlapping region of the gate line and the data line; an source electrode of the thin film transistor has a hollow region; a drain electrode of the thin film transistor is arranged in the hollow region of the source electrode, and a closed channel region is formed between the source electrode and the drain electrode. Because of design of a location of the thin film transistor according to the embodiment of the present invention, the opening ratio can be increased, the slightly rubbing region adjacent to the thin film transistor can be reduced; and, because of a design of the closed channel region of the embodiments of the present invention, levels at various positions of the thin film transistor can be uniform, and a bigger contact area is provided for the supporting post, thereby increasing supporting ability of the supporting post and compressive property of the panel.

Obviously, it is obvious to modify and change the embodiments of the present invention without departing from insipirit and scope of the present invention. These modification and change to the embodiments of the present invention shall be covered in the scope of the present invention if they fall within the scope of the claims and equivalents.

The invention claimed is:

1. An array substrate, comprising:
a substrate;
a gate line and a data line arranged on the substrate; and
a thin film transistor arranged in an overlapping region where the gate line and the data line are overlapped; wherein:
an orthogonal projection of the thin film transistor on the substrate covers an orthogonal projection of the overlapping region of the gate line and the data line on the substrate;
wherein a source electrode of the thin film transistor has a hollow region; and
a drain electrode of the thin film transistor is arranged in the hollow region of the source electrode and a closed channel region is formed between the source electrode and the drain electrode.

2. The array substrate as claimed in claim 1, wherein:
a pattern of the closed channel region is a closed ring-shaped pattern.

3. The array substrate as claimed in claim 2, wherein:
a center of the overlapping region of the gate line and the data line coincides with a center of the channel region.

4. The array substrate as claimed in claim 3, wherein:
a center of the overlapping region of the gate line and the data line coincides with a center of the channel region.

5. The array substrate as claimed in claim 1, wherein:
a source electrode of the thin film transistor has first patterns located on both sides of the data line and protruded from the data line;
a gate electrode of the thin film transistor has second patterns located on both sides of the gate line and protruded from the gate line; and
an orthogonal projection of the first pattern protruded from the data line on the substrate at least partially overlaps with an orthogonal projection of the second pattern protruded from the gate line on the substrate.

6. The array substrate as claimed in claim 1, wherein:
the source electrode of the thin film transistor has first patterns located on both sides of the data line and protruded from the data line;
the gate electrode of the thin film transistor has second patterns located on both sides of the gate line and protruded from the gate line;
an orthogonal projection of the first pattern protruded from the data line on the substrate at least partially overlaps with an orthogonal projection of the second pattern protruded from the gate line on the substrate.

7. The array substrate as claimed in claim 5, wherein:
the first patterns protruded from the data line and the second patterns protruded from the gate line are each a triangle pattern.

8. The array substrate as claimed in claim 6, wherein:
the first patterns protruded from the data line and the second patterns protruded from the gate line are each a triangle pattern.

9. The array substrate as claimed in claim 5, wherein:
an orthogonal projection of the source electrode on the substrate fully coincides with an orthogonal projection of the gate electrode on the substrate.

10. The array substrate as claimed in claim 6, wherein:
an orthogonal projection of the source electrode on the substrate fully coincides with an orthogonal projection of the gate electrode on the substrate.

11. The array substrate as claimed in claim 7, wherein:
a rubbing direction of an orientation film on the substrate is consistent with an extending direction of the data line and the rubbing direction is a direction from a first side of the first pattern protruded from the data line towards a second side thereof; and a length of the first side is smaller than a length of the second side and the first side is located upstream of the second side in the rubbing direction.

12. The array substrate as claimed in claim 8, wherein:
a rubbing direction of an orientation film on the substrate is consistent with an extending direction of the data line and the rubbing direction is a direction from a first side of the first pattern protruded from the data line towards a second side thereof; and a length of the first side is smaller than a length of the second side and the first side is located upstream of the second side in the rubbing direction.

13. A display panel comprising the array substrate as claimed in claim 1 and an opposite substrate, which are arranged to be opposite to each other.

14. The display panel as claimed in claim 13, wherein a black matrix is provided on the array substrate or the opposite substrate and an orthogonal projection of the black matrix on the substrate covers an orthogonal projection of the thin film transistor on the substrate.

15. A display device comprising the display panel as claimed in claim 13.

* * * * *